United States Patent
Kadosh et al.

[11] Patent Number: 5,818,069
[45] Date of Patent: Oct. 6, 1998

[54] ULTRA HIGH DENSITY SERIES-CONNECTED TRANSISTORS FORMED ON SEPARATE ELEVATIONAL LEVELS

[75] Inventors: Daniel Kadosh, Austin; Mark I. Gardner, Cedar Creek, both of Tex.

[73] Assignee: Advanced Micro Devices, Inc.

[21] Appl. No.: 879,509

[22] Filed: Jun. 20, 1997

[51] Int. Cl.$^6$ .......... H01L 29/76; H01L 31/036; H01L 31/112
[52] U.S. Cl. .......... 257/67; 257/368; 257/383
[58] Field of Search .......... 257/67, 69, 368, 257/382, 383

[56] References Cited

U.S. PATENT DOCUMENTS

| | | | |
|---|---|---|---|
| 4,381,201 | 4/1983 | Sakurai . | |
| 4,630,089 | 12/1986 | Sasaki et al. . | |
| 4,669,062 | 5/1987 | Nakano . | |
| 4,679,299 | 7/1987 | Szluk et al. . | |
| 4,698,659 | 10/1987 | Mizutani . | |
| 5,172,203 | 12/1992 | Hayashi | 257/66 |
| 5,365,081 | 11/1994 | Yamagaki et al. | 257/67 |
| 5,483,083 | 1/1996 | Meguro et al. | 257/69 |

Primary Examiner—Ngân V. Ngô
Attorney, Agent, or Firm—Kevin L. Daffer; Conley, Rose & Tayon

[57] ABSTRACT

A three-dimensional integrated circuit and fabrication process is provided for producing active and passive devices on various levels of the integrated circuit. The present process is particularly suited to interconnecting a source of one transistor to a drain of another to form series-connected transistors often employed in core logic units. A junction of an underlying transistor can be connected to a junction of an overlying transistor, with both transistors separated by an interlevel dielectric. The lower transistor junction is connected to the upper level transistor junction using a plug conductor. The plug conductor and, more specifically, the mutually connected junction, is further coupled to a laterally extended interconnect. The interconnect extends from the mutual connection point of the plug conductor to a substrate of the overlying transistor. Accordingly, the source and substrate of the overlying transistor can be connected to a drain of the underlying transistor to not only achieve series-connection but also to connect the source and substrate of an internally configured transistor for the purpose of reducing body effects.

10 Claims, 5 Drawing Sheets

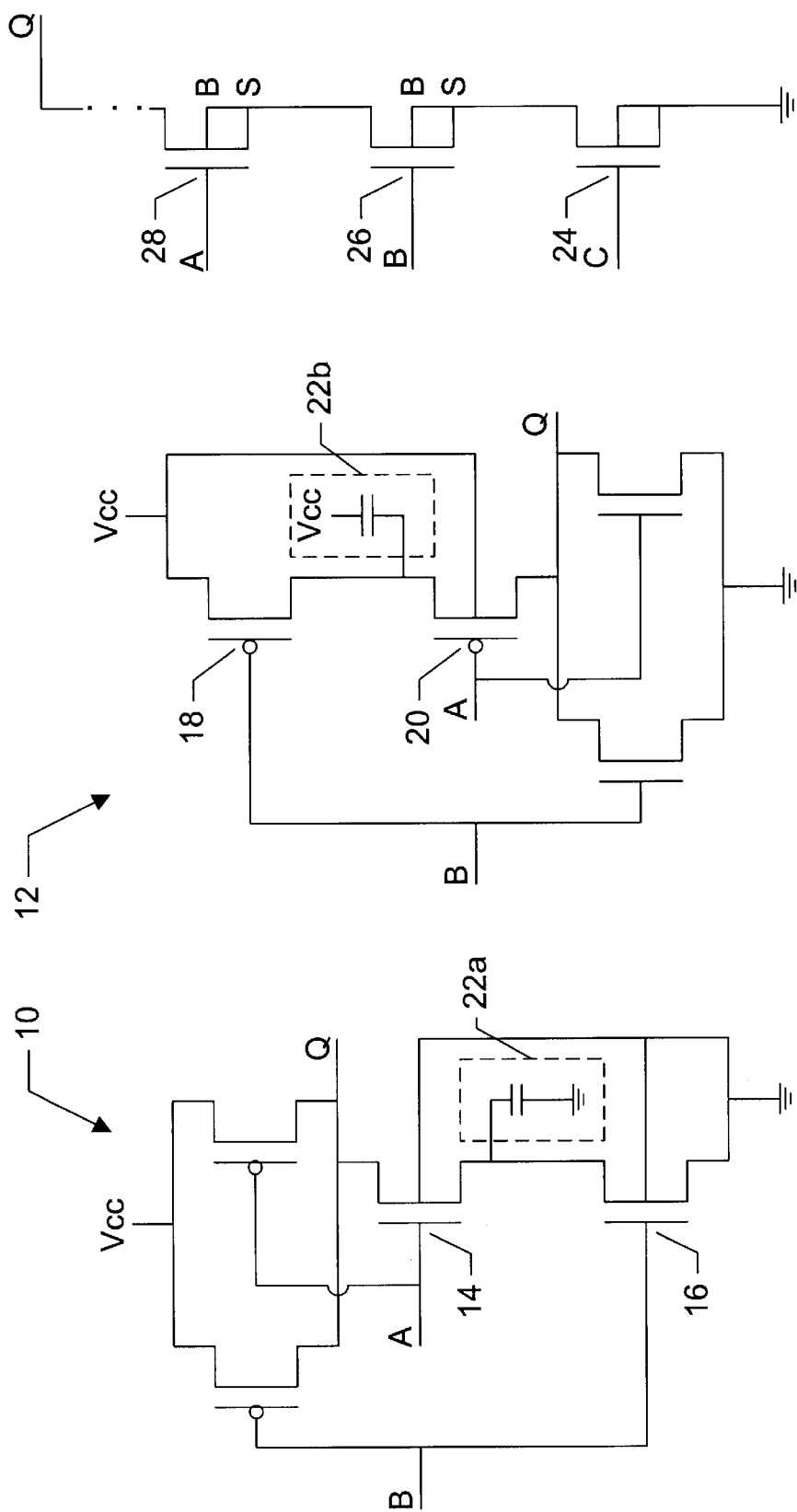

ULTRA HIGH DENSITY SERIES-CONNECTED TRANSISTORS FORMED ON SEPARATE ELEVATIONAL LEVELS

BACKGROUND OF THE INVENTION

1. Field of the Invention

This invention relates to integrated circuit manufacture and, more particularly, to transistors formed on separate elevational levels and an interconnect routed between source and substrate regions on the upper level transistor to a drain of the lower level transistor to configure a high performance, high density integrated circuit.

2. Description of the Relevant Art

The structure and the various components, or features, of a metal oxide semiconductor ("MOS") are generally well known. A MOS transistor typically comprises a substrate material onto which a patterned gate conductor is formed. The gate conductor serves to self-align impurities forwarded into the substrate on opposite sides of the gate conductor. The impurities placed into the substrate define a junction region, also known as source/drain regions. The gate conductor is patterned from a layer of polysilicon using various lithography techniques.

A typical n-channel MOS (NMOS) transistor employs n-type junctions placed into a p-type substrate. Conversely, a typical p-channel MOS (PMOS) transistor comprises p-type junctions placed into an n-type substrate. The substrate comprises an entire monolithic silicon wafer, of which a portion of the substrate known as a "well" exists. The well is doped opposite the substrate so that it can accommodate junctions of an impurity type opposite junctions in the non-well areas. Accordingly, wells are often employed when both n-type and p-type transistors (i.e., CMOS) are needed.

A pervasive trend in modern integrated circuit manufacture is to produce transistors having feature sizes as small as possible. To achieve a high density integrated circuit, features such as the gate conductor, source/drain junctions, and interconnect to the junctions must be as small as possible. Many modem day processes employ features which have less than 1.0 $\mu$m critical dimension. As feature size decreases, the resulting transistor as well as the interconnect between transistors also decreases. Smaller transistors allows more transistors to be placed on a single monolithic substrate, thereby allowing relatively large circuit systems to be incorporated on a single, relatively small die area.

The benefits of high density circuits can only be realized if advanced processing techniques are used. For example, semiconductor process engineers and researchers often study the benefits of electron beam lithography and x-ray lithography to achieve the lower resolutions needed for submicron features. To some extent wet etch has given way to a more advanced anisotropic (dry etch) technique. Further, silicides and polycides have replaced higher resistivity contact structures mostly due to the lower resistivity needed when a smaller contact area is encountered.

There are many numerous other techniques used to achieve a higher density circuit, however, these techniques as well as others still must contend with problems resulting from higher density itself. Even the most advanced processing techniques cannot in all instances offset the problems associated with small features or features arranged extremely close to one another. For example, as the channel length decreases, short channel effects ("SCE") generally occur. SCE cause threshold voltage skews at the channel edges as well as excessive subthreshold currents (e.g., punch through and drain-induced barrier lowering). Related to SCE is the problem of hot carrier injection ("HCI"). As the channel shortens and the supply voltage remains constant, the electric field across the drain-to-channel junction becomes excessive. Excessive electric field can give rise to so called hot carriers and the injection of those carriers into the gate oxide which resides between the substrate (or well) and the overlying gate conductor. Injection of hot carriers should be avoided since those carriers can become trapped and skew the turn-on voltage of the ensuing transistor.

It appears as though even the most advanced processing techniques cannot avoid in all instances the problems which arise as a result of high density fabrication. As features are shrunk and are drawn closer together across a single topological surface, the closeness of those features causes numerous problems even under the most advanced processing conditions. It therefore appears that there may be a certain limitation beyond which feature sizes cannot be reduced if those features are to reside on the single elevational level. It would therefore be desirable to derive a processing technique which can produce features on more than one level. That is, it would be beneficial that this multi-level processing technique produce both active (transistors) and passive (capacitors, resistors, etc.) in three dimensions so as to enhance the overall circuit density without incurring harmful side effects associated with feature shrinkage and closeness.

Before a three-dimensional, multi-level transistor fabrication process can be introduced, however, the process must pay careful attention to the interconnection between transistors placed on separate levels. Therefore, it is desirable to derive an interconnect scheme which can connect various features on one elevation (topological) level to features on another level. That interconnection must be as short as possible in order to minimize resistance in critical routing conductors between transistors. The desired fabrication process must therefore incorporate not only multi-level fabrication but also high performance interconnect routing as an essential part of that process.

Most logic block portions of an integrated circuit comprise transistors interconnected in various ways. For example, combinatorial logic includes, for example, NAND gates and NOR gates. Both NAND and NOR gates include series-connected transistors. More specifically, the source-drain paths of two or more transistors are connected in series between a power conductor and an output node. An example of a two-input NAND gate is shown in FIG. 1 as reference numeral 10. FIG. 2 illustrates a counterpart two-input NOR gate 12. NAND gate 10 includes a pair of n-channel transistors 14 and 15 connected in series between a ground terminal and an output Q. NOR gate 12 includes a pair of p-channel transistors 18 and 20 connected in series between a power supply and output Q.

The series-connections between two or more transistors, regardless of whether the transistors are n-channel or p-channel, presents a unique set of problems. For example, parasitic capacitance 22a and 22b is attributed to the connection between a source junction of one transistor and a drain junction of another transistor.

Parasitic capacitance 22 is the normal response of voltage placed upon a diffused junction area. Whenever the junction is coupled separate from the substrate (or "body"), capacitance occurs therebetween. More importantly, a voltage difference arises between the junction and substrate, often referred to as the "body effect". Body effect is the term given to the modification of threshold voltage, demonstrated as a voltage difference between the source and substrate areas. In the example provided, n-channel transistor coupled at output Q will switch slower if the transistor source potential is not the same as the substrate. In most instances, the substrate will be coupled to power/ground, leaving the source of transistor 14 floating dissimilar from ground. To illustrate how the body effect changes the threshold voltage of transistor 14, it is recognized that voltages at the input of nodes A and B may be selected such that voltage on capacitor 22a is charged. If the inputs are then set to a logic 1, the source terminal of transistor 14 will transition to a voltage of $V_{cc}$ minus a threshold voltage. Thus, transistor 16 will have to discharge the source node associated with capacitor 22a in order to turn on transistor 14. In summary, body effect implies the fall time of transistor 14 will be slower than transistor 16. The converse applies to the transistors 18 and 20 of FIG. 2.

To minimize the body effect, it is important to minimize capacitance at the internal nodes of series-connected transistors. FIGS. 1 and 2 depict only a two-input gate structure; however, it is recognized that more than two inputs and therefore more than two series-connected transistors may be used in many logic designs. The body effect is exacerbated with the addition of transistors coupled in series. Many design strategies are to place transistors with the latest arriving signals nearest the output Q of the series-connected transistors. The early signals in effect "discharge" internal nodes attributed to parasitic capacitance 22. The late arriving signals therefore have the parasitic capacitance of that node discharged with minimum body effect. Another, more workable strategy is to couple the source node to the substrate or body.

FIG. 3 illustrates a series-connected set of transistors. The transistors are shown as n-channel transistors; however, p-channel transistors may equally and alternatively be employed. Series-connected transistors 24, 26 and 28 are shown connected between a power/ground supply and an output node Q. The technique for minimizing parasitic capacitance and body effect deals principally with connecting source S terminal of transistor 26 to the substrate (i.e., body) B, and also connecting the source S of transistor 28 to body B. It may not be necessary, however, to connect the source and body of transistor 24; it is more important to connect the internal source nodes of transistors 26, 27, etc.

Referring to FIG. 4, a conventional manner for coupling source and substrate/body regions is shown. In particular, FIG. 4 illustrates a transistor (either transistor 14 or transistor 20 shown in FIGS. 1 and 2). Arranged on one side of a gate conductor 30 is a source region 32. Source 32 may extend to the lateral boundary of a metal conductor 34. Metal conductor 34 includes a series of contacts 36 which extend from conductor 34 downward to source 32. Conductor 34 may extend laterally from source 32 to an implant region of a type dissimilar from source 32. The latter implant is known as a well implant, and is indicated as reference numeral 38. Well implant 38 matches the implant dopant used for the substrate, opposite the source/drain implant. Well implant 38 electrically receives coupling from conductor 34 via contacts 40.

FIG. 4 illustrates transistor 14/20 formed upon a single elevation level and, more importantly, the additional space requirements needed to accommodate source-to-substrate connection. That space requirement is primarily mandated by the additional well implant 38, and the spacing needed between well 38 and source/drain implant 32. Thus, while it is beneficial to couple the internal source node to a substrate, the costs involved with that coupling is demonstrated mostly in terms of additional layout space.

It would be desirable to derive a manufacturing process which can reduce the body effect by mutually connecting the source junction to the body whenever series-connected transistors are encountered. It would be further desirable to perform the interconnection as a multi-level processing technique. More specifically, an advancement may be made if the source and body connection of one transistor can be further connected to a drain of another transistor, both transistors of which are arranged on separate elevation levels. The improved interconnect scheme is one having limited routing. A relatively short source-substrate-drain interconnect has minimum resistance, capacitance and inductance, the result of which is a high performance, high density integrated circuit.

SUMMARY OF THE INVENTION

The problems outlined above are in large part solved by a multi-level transistor fabrication technique. The present technique can produce one or more active or passive devices on a first level, followed by one or more active or passive devices on a second level. The first level is substantially planar and extends across an entire wafer surface. The second level is also substantially planar and parallel to the first level, but spaced by a dielectric therefrom.

According to a preferred embodiment, the multi-level transistor fabrication technique is suitable for producing at least one transistor on the first level and at least one transistor on the second level. The first and second level transistors each comprise respective source and drain regions. The source region of the first transistor is connected to the drain region of the second transistor to form a series-connection. An interconnect is used to form the series connection. Coupled between the interconnect and the respective source and drain junctions may be a silicide. The interconnect may extend from the drain region of a first transistor upward to a source region of a second transistor. Interconnect therefore extends across an interlevel dielectric which separates the first and second transistors. The interconnect may further extend in a lateral direction from the source of the second transistor to the substrate of the second transistor. Resulting from the way in which the second transistor is confined within a localized substrate, interconnection between the source and substrate of the second transistor can be relatively short.

The process of forming the first and second transistors on separate elevation levels, and interconnecting a drain of the first transistor to a source of the second transistor is replicated and equally applicable to numerous other transistors arranged on the first and second levels. Thus, according to a preferred embodiment, there may be more than two transistors connected in series, and more than two separate elevation levels needed to accommodate more than two series-connected transistors.

By interconnecting two or more series-connected n-or p-channel transistors, the present technique is applicable to any logic block which requires series-connection. For example, the present process is applicable to series-connected transistors in NAND gates and/or NOR gates. More importantly, however, is the relatively short interconnection used to link a source of one transistor to a drain of another. Equally important is the short interconnection between the source of one transistor to the substrate of that transistor. Source-to-substrate connection is carried out without having to form an independent well region, and spacing of that well region from the source/drain implant area. As such, the lateral dimension of a transistor having source-to-substrate connection is relatively small. This not only allows high density integrated circuits, but also implements short interconnect with minimum resistive, capacitive, and inductive loading.

Broadly speaking, the present invention contemplates forming a pair (or more) of transistors having source/drain paths of each transistor connected in series to a power supply. A first transistor of the pair is provided having a first gate conductor arranged upon a first substrate between a first source implant and a first drain implant. An interlevel dielectric is deposited upon the first source implant, upon the drain implant and upon the first gate conductor. A second substrate is then formed within the interlevel dielectric a spaced distance above and laterally offset from at least a portion of the first gate conductor. A conductive plug is formed through the interlevel dielectric to the first drain implant. The conductive plug abuts a lateral surface of the second substrate. A second transistor of the pair is then formed having a second gate conductor arranged upon the second substrate between a second source implant and a second drain implant. The second source implant is proximate to the conductive plug. An interconnect is patterned across a portion of the second substrate in electrical communication with both the second substrate and the second source.

Preferably, a portion of the interconnect is patterned upon the plug. The combination of interconnect and plug forms a relatively short conductive path between the interconnected-coupled source and substrate of the second transistor to the drain of the first transistor.

The second substrate is preferably formed within a localized region of the interlevel dielectric. Specifically, the second substrate is brought about by etching a trench into the interlevel dielectric upper surface, and then filling the trench with preferably a polycrystalline silicon ("polysilicon") material. Polysilicon material is rendered conductive by doping it with either an n-type or p-type species.

The conductive plug is formed by etching an opening through a portion of the interlevel dielectric to the first drain. The opening extends perpendicular to the drain upper surface and selective to interlevel dielectric. Interlevel dielectric is removed from a sidewall surface of a polysilicon substrate. The sidewall surface, however, is doped with a source implant. When the opening is filled with a conductive material, the sidewall surface and, more specifically, the source region of the second transistor is coupled with the drain of the first transistor.

The present invention further contemplates a series-connected pair of transistors. The pair of transistors comprises a first transistor and a second transistor. The second transistor is arranged upon and within a second topography extending a dielectric distance above the first transistor topography. A first conductive element is configured from a lateral surface of the second transistor source to an upper surface of the first transistor drain. Likewise, a second conductive element is configured from the second transistor source to an upper surface of the second topography.

Preferably, the second topography comprises a substrate into which the second source and drain regions are laterally bound. The second topography comprises an isolated region of polysilicon containing the entirety of the second source and drain implant regions.

BRIEF DESCRIPTION OF THE DRAWINGS

Other objects and advantages of the invention will become apparent upon reading the following detailed description and upon reference to the accompanying drawings in which:

FIG. 1 is a circuit schematic of a pair of series-connected, n-channel transistors embodied within a NAND gate having parasitic source capacitance and body bias associated with the series connection according to a conventional layout design;

FIG. 2 is a circuit schematic of a pair of series-connected, p-channel transistors embodied within a NOR gate having parasitic source capacitance and body bias associated with the series connection according to a conventional layout design;

FIG. 3 is a circuit schematic of three or more transistors having source and substrate connection on each respective transistor to minimize body bias effects according to a layout design;

Figure 4:
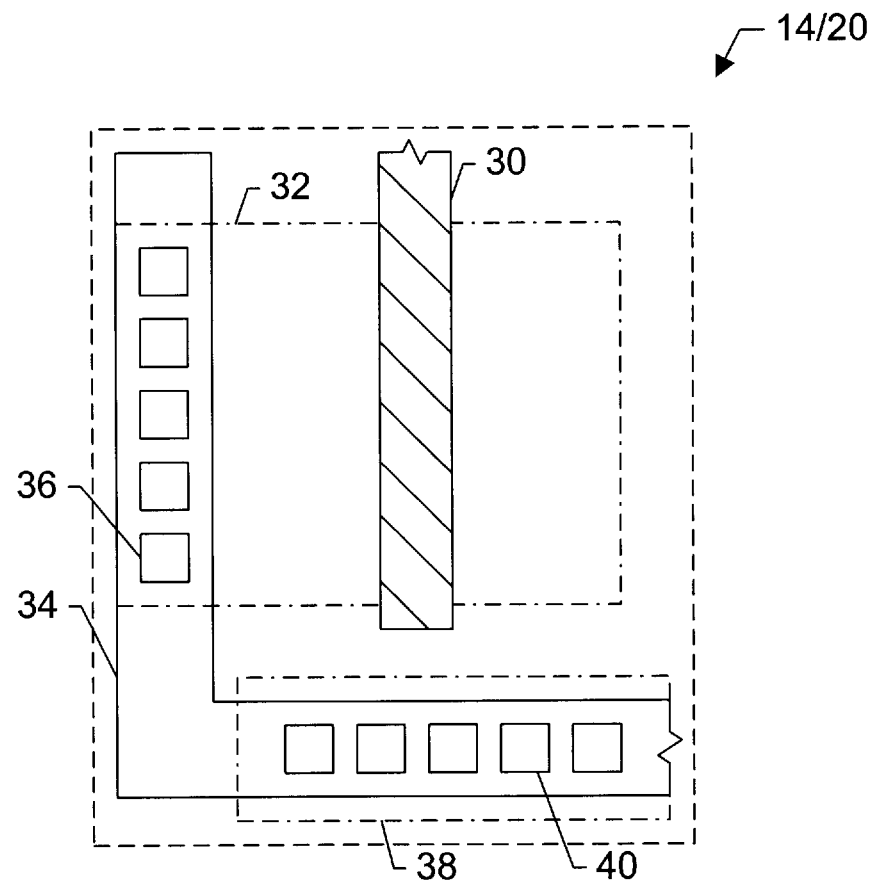
FIG. 4 is a top plan view of various features used to effectuate source and substrate connection a single elevation level within a substrate having a dedicated well (or tub) connection.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIGS. 5 through 12 illustrate a processing sequence. The sequence includes numerous fabrication steps, some of which are shown, beginning with FIG. 5 and ending with FIG. 12. It is understood, however, that numerous other steps are involved. However, for sake of brevity and clarity, only a subset of the entire fabrication sequence is provided. It is understood, however, that the steps used in forming those shown, and interim steps between those shown, would be readily known and appreciated by those skilled in the art given the present disclosure information.

Figure 5:
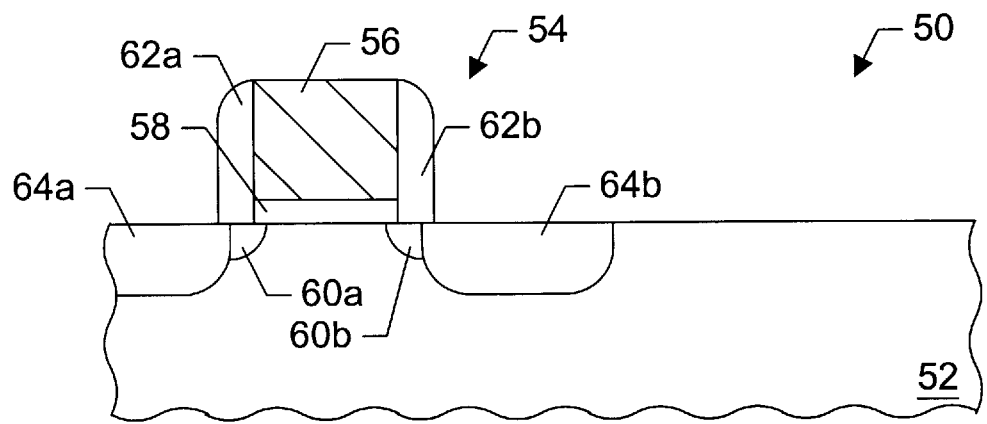
FIG. 5 is partial cross-sectional view of a semiconductor topography and a first transistor formed upon and within a first substrate extending along a first elevation level.

FIG. 5 illustrates a semiconductor topography 50 comprising a substrate 52 and a first transistor 54 arranged upon and within substrate 52. Topography 50 may include numerous active and passive devices. Used merely as an illustrative example, only one active device is shown as reference numeral 54. Substrate 52 preferably includes a silicon-based substrate of single crystalline material, doped either n-type or p-type.

First transistor 54 is formed by patterning a gate conductor 56 upon a gate dielectric 58. Gate conductor 56 is preferably polysilicon, and gate dielectric 58 is preferably thermally grown oxide. Next, sidewall spacers 62 are formed on opposing sidewalls surfaces of gate conductor 56. Thereafter, source/drain implants are forwarded, using both gate conductor 56 and sidewall spacers 62 as a mask. The source/drain implants are labeled as reference numeral 64. Implant 64b is self-aligned to spacer 62b and is denoted henceforth as the drain region. Conversely, implant 64a opposite the channel from drain region 64b is henceforth referred to as the "source region". Lightly doped drain ("LDD") regions 60 are deposited prior to regions 64 using sidewall surfaces of gate conductor 56 as a mask.

The significance of source and drain regions 64 is set forth primarily in their interconnection to a power conductor and another transistor formed on a separate elevational level. Preferably, source 64a is connected to a positive power supply ($V_{cc}$) or ground depending on whether the source/drain implant is p-type or n-type. Accordingly, first transistor 54 may be the transistor placed adjacent the power supply. Additional transistors may be connected in series to drain 64b from a transistor within a topography elevationally raised above topography 50. A technique used to produce a second transistor and the interconnection thereof is initially shown in reference to FIG. 6.

Figure 6:
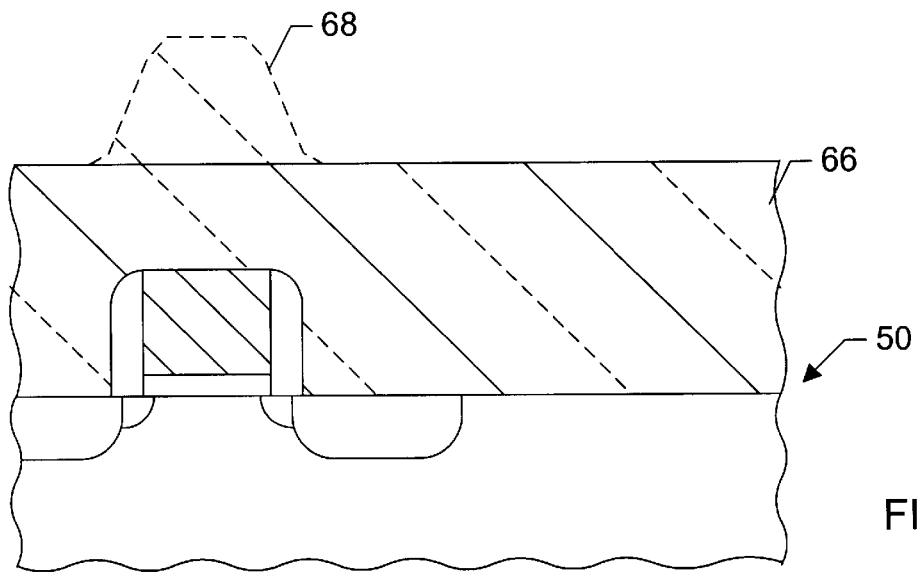
FIG. 6 is a partial cross-sectional view of a semiconductor topography having a first interlevel dielectric placed in planar fashion over the first transistor.

FIG. 6 illustrates an interlevel dielectric 66 formed upon first topography 50. Dielectric 66 is first deposited across topography 50 using various chemical vapor deposition and/or spin-on techniques. Dielectric 66 may be formed from a silane, silica, oxide or glass-based material. After deposition and/or cure, the deposited material can be planarized if desired. Planarization may involve an etch back or chemical-mechanical polish ("CMP"). The removed elevationally raised regions are shown in dashed line as reference numeral 68.

Figure 7:
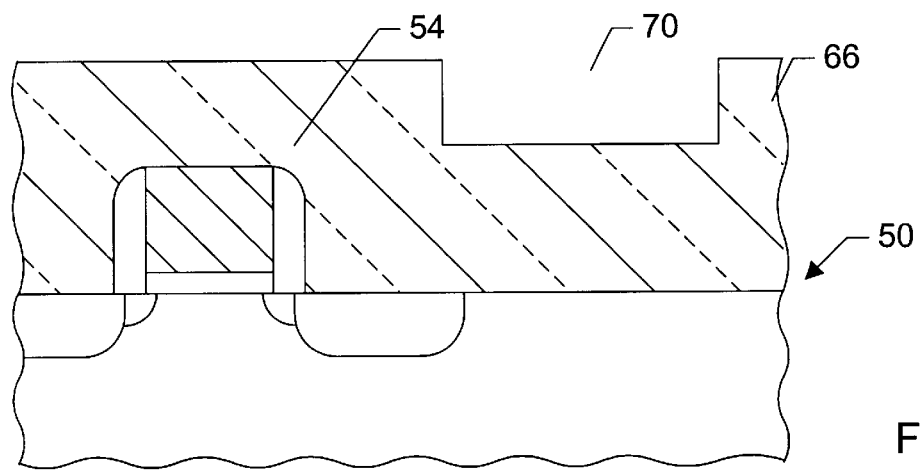
FIG. 7 is a partial cross-sectional view of a semiconductor topography having a trench formed within the first interlevel dielectric a lateral spaced distance from the first transistor.

FIG. 7 illustrates exposing a portion of interlevel dielectric 66 using, for example, conventional lithography techniques. Thereafter, a wet or dry etchant is used to remove the upper surface of dielectric 66 to an elevation level below the upper surface. The etching step therefore forms a trench 70 within dielectric 66 a lateral spaced distance from at least a portion of first transistor 54. Trench 70 is also formed a dielectric spaced distance above topography 50 and more importantly, above at least a portion of first transistor 54. Trench 70 may be any suitably formed depth which can accommodate a substrate height. More importantly, the depth is chosen such that a source/drain implant depth may extend to the base or bottom of a substrate formed exclusively within trench 70.

Figure 8:
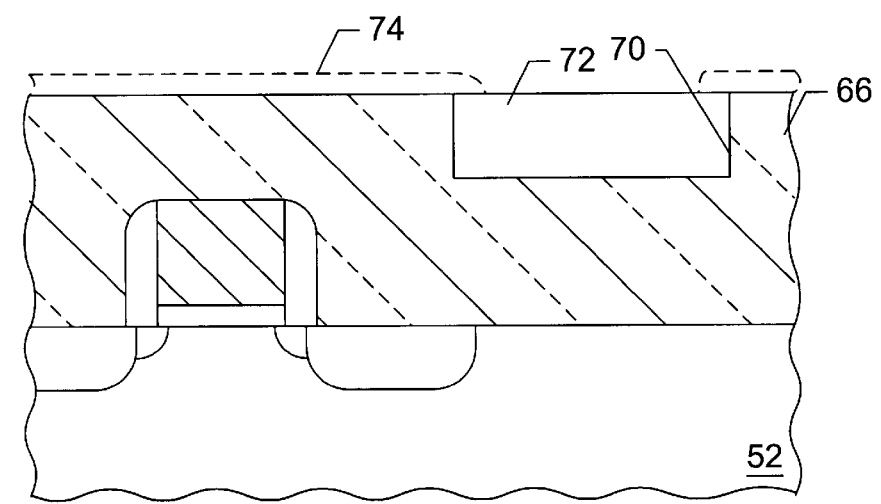
FIG. 8 is a partial cross-sectional view of a semiconductor topography having a second substrate formed within the trench along a second elevation level above the first elevation level.

FIG. 8 illustrates a processing step subsequent to FIG. 7, whereby a semiconductor material 72 is deposited across the surface of interlevel dielectric 66. Specifically, material 72 fills trench 70. A subsequent planarization step may be performed to remove material 72 from the upper surface of interlevel dielectric 66 outside of trench 70. The removed portions of material 72 are shown in dashed line 74, while the retained portion is designated as numeral 72. The upper surface of the retained portion 72 is substantially equal to the upper surface of interlevel dielectric 66 outside of trench 70. Various planarization techniques may be used to achieve this goal, a suitable technique includes CMP. Thereafter, the retained portion 72 is a substrate which can be doped extensively throughout its profile cross-section. The dopant used preferably matches the same dopant type used in substrate 52. Doping is achieved by blanket implanting across the entire topography, including interlevel dielectric 66 and substrate 72. It is substrate 72, however, that readily receives the dopant. Thus, substrate 72 is preferably a polysilicon, whereas interlevel dielectric 66 is a highly dense oxide, at least on its upper surface. Interlevel dielectric 66 does not readily accept dopants implanted into polysilicon 72. In instances where it does, then the upper surface may be sacrificially removed below the dopant region commensurate with removing the upper surface of polysilicon 72. In either instance, the intent is that dopant reside primarily, if not exclusively within polysilicon 72 and not upon or within interlevel dielectric 66.

Figure 9:
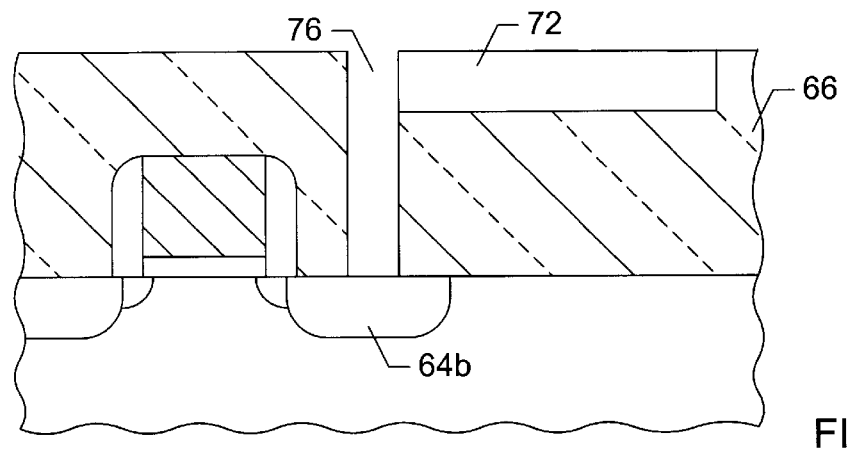
FIG. 9 is a partial cross-sectional view of a semiconductor topography having a via opening formed adjacent the second substrate, through the interlevel dielectric and to a junction of the first transistor.

Referring to FIG. 9, a processing step subsequent to FIG. 8 is shown. FIG. 9 illustrates an opening 76 which extends entirely through interlevel dielectric 66 to drain 64b. Opening 76 is produced by placing a masking layer across the topography comprising second substrate 72 and interlevel dielectric level 66. The masking material is then patterned such that the region to be opened is exposed. The exposed region is then subjected to an etch which, according to one embodiment, is a dry (anisotropic) etchant. The etchant is chosen such that it is selective to removing primarily if not exclusively the interlevel dielectric material thereby retaining polysilicon and/or single crystalline silicon. The etchant therefore removes interlevel dielectric from a localized region of a sidewall surface of second substrate 72. The exposed portion of polysilicon 72 sidewall is provided for the benefits shown in FIG. 10.

Figure 10:
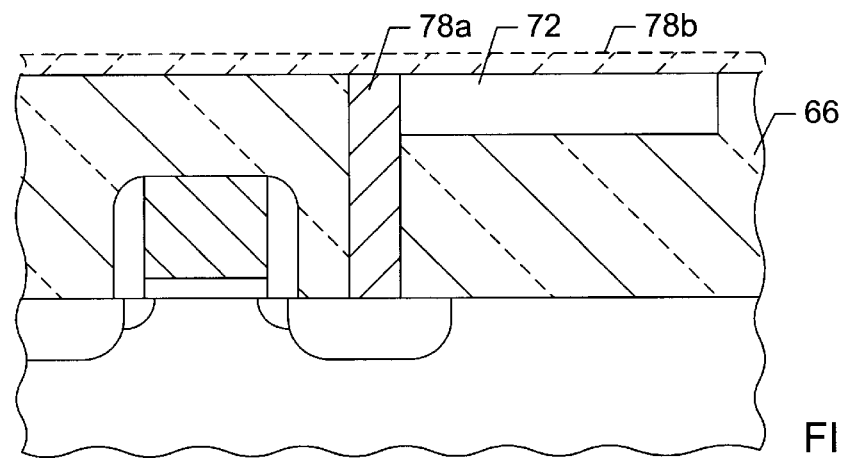
FIG. 10 is a partial cross-sectional view of a semiconductor topography having a conductive material formed exclusively within the via opening to form a plug.

FIG. 10 illustrates a conductive material 78 deposited into opening 76 and across the surface formed by second substrate 72 and interlevel dielectric 66. Material 78 fills opening 76 by blanket depositing a layer of material to a thickness which is greater than the depth of opening 76. Thereafter, the upper regions of the conductive material 78 are removed using, for example, sacrificial etchback or CMP. The removed portions of material 78 are shown as reference numeral 78b, while the retained portions are shown as reference numeral 78a. The retained portion is henceforth referred to as a plug conductor which extends from a lateral sidewall surface of second substrate 72 to an upper surface of first drain 64b. Conductive plug 78a can be made of any conductive material which readily flows and fills openings with large aspect ratios (i.e., deep openings with a relatively small lateral area). A suitable conductive material includes, for example, titanium, tungsten, titanium nitride, aluminum, copper, etc. applied in layers or as an alloy.

Figure 11:
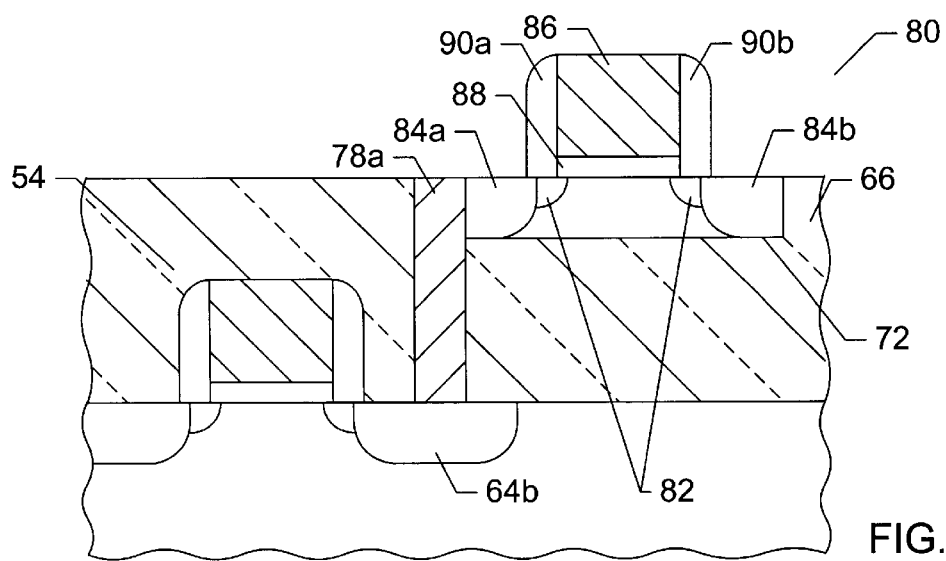
FIG. 11 is a partial cross-sectional view of a semiconductor topography having a second transistor formed upon and within the second substrate.

FIG. 11 illustrates formation of a second transistor 80 exclusively upon and within second substrate 72. Second substrate 72 contains LDD implants 82 and source/drain implants 84. Implants 82 and 84 are self-aligned to gate conductor 86 and sidewall spacers 90, respectively, similar to the sequence used in forming first transistor 54.

The depth or range in which source/drain implant 84 extends is preferably to the entire thickness of substrate 72 for the region encompassed by the source/drain implant. Accordingly, a channel appears between source/drain 84 of second transistor 80. The channel can be periodically inverted based on the voltage across the gate and source areas.

FIG. 11 illustrates source 84a contacting a sidewall surface of conductive plug 78a. Conductive plug 78a thereby provides an electrical conduit between source 84a of second transistor 80 and drain 64b of first transistor 54. More specifically, conductive plug 78a provides series connectivity between the source/drain path of first transistor 54 and the source/drain path of second transistor 80. Preferably, series-connection is effectuated by a plug which extends perpendicular to the first and second transistor lateral planes (or elevations). Second transistor 80 can be drawn closer to first transistor 54 in a lateral direction than the transistor pair embodied in a single elevation plane. Lateral density is therefore enhanced.

Figure 12:
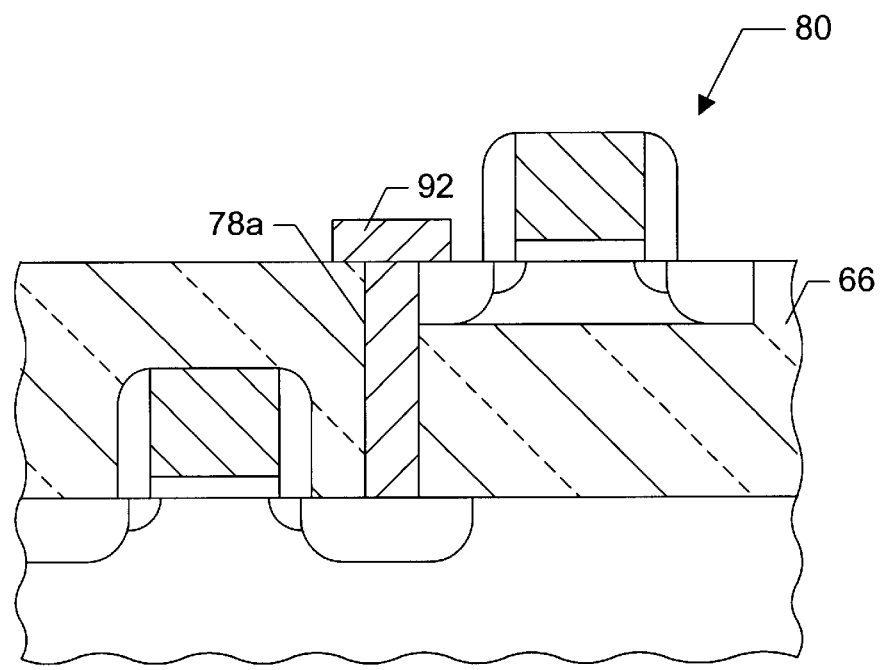
FIG. 12 is a partial cross-sectional view of a semiconductor topography having an interconnect patterned upon portions of the interlevel dielectric and the plug to complete source and substrate connection of the second transistor.

FIG. 12 illustrates a cross-sectional view of a laterally extending interconnect 92. A portion of interconnect 92 extends across conductive plug 78a. Interconnect 92 is formed by depositing a conductive layer across a second topography comprising second transistor 80 and interlevel dielectric 66. Thereafter, portions of the blanket-deposited layer are removed using lithography techniques. The retained portion is therefore said to be patterned, and is denoted as reference numeral 92.

Figure 13:
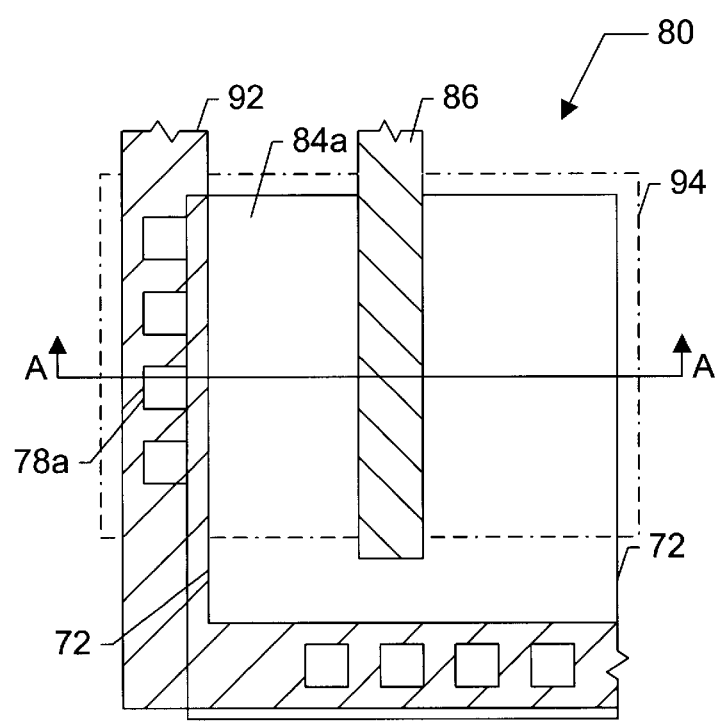
FIG. 13 is a top plan view of the second transistor illustrating a high density source and substrate connection.

Interconnect 92 and its relevance as a lateral conductor is better illustrated in reference to FIG. 13. FIG. 13 depicts a top layout view of various features used in forming second transistor 80. The cross-section of the second transistor 80 according to that shown in FIG. 12 is illustrated along the plane denoted as A—A in FIG. 13. Interconnect 92 extends preferably as a metal interconnect, suitably formed from, for example, aluminum, aluminum silicide, copper, etc. Interconnect 92 couples to the underlying transistor drain (not shown) through contact/plug 78a. There may be several plugs as needed to produce a highly conductive source-to-drain connection between transistor pairs. Source region 84a of transistor 80 laterally extends from the channel beneath gate conductor 86 to plug 78a. The sidewall surface of source 84a, defined as the sidewall surface of second substrate 72, therefore abuts with a sidewall surface of one or more plugs 78a.

Interconnect 92 routes electrical signals from the mutually connected, underlying drain (not shown) and source 84a from the source/drain implant area 94 to an area of substrate 72 outside implant 94. Connection to substrate 72 exclusive of source/drain implant 94 can occur either on the upper surface of substrate 72 laterally in front of or behind plane A—A. Connection exclusive of the implant region can also occur possibly on the lateral surface of substrate 72 in front of or behind plane A—A. In the latter instance, connection at the sidewall surface of substrate 72 occurs similar to the connection at the sidewall surface of source region 84a except that a source/drain implant is not present.

FIG. 13 illustrates relatively short interconnection between a source and substrate (or body) of a transistor formed within a localized, polysilicon substrate. Interconnection of source-to-substrate occurs without having to form a separate well area and the spacing of that well area from the substrate. Thus, a substrate formed within a trench can be selectively doped without having to form spaced well areas, the benefit of which is to produce a high density, high performance source-to-substrate connection in addition to a source-to-underlying drain connection.

Various modifications and changes may be made to each and every processing step without departing from the spirit and scope of the invention provided the interconnect concepts set forth in the claims are retained. It is intended that the following claims be interpreted to embrace all such modifications and changes and, accordingly, the specification and drawings are to be regarded in an illustrative rather than a restrictive sense.

What is claimed is:

1. A series-connected pair of transistors, comprising:
    a first transistor having a first source implant, a first drain implant and a first gate conductor arranged upon and within a first semiconductor substrate;
    a second transistor having a second source implant, a second drain implant and a second gate conductor arranged upon and within a second semiconductor substrate extending in an elevational plane a dielectric distance above said first semiconductor substrate;
    a first conductive element extending from a lateral surface of said second source implant to an upper surface of said first drain implant; and
    a second conductive element extending across said second source implant and a portion of the second semiconductor substrate exterior to said second source implant.

2. The series-connected pair of transistors as recited in claim 1, wherein said second substrate is arranged within an interlevel dielectric formed upon said first substrate, and wherein said second source and drain implants are laterally bound within said second substrate.

3. The series-connected pair of transistors as recited in claim 1, wherein said second substrate comprises polycrystalline silicon in which the entirety of said second source and drain implants is arranged.

4. The series-connected pair of transistors as recited in claim 1, wherein said first conductive element comprises a conductive plug extending along an axis between and substantially perpendicular to said first and second substrates.

5. The series-connected pair of transistors as recited in claim 1, wherein said first conductive element is in electrical communication with said second source implant and said first drain implant.

6. The series-connected pair of transistors as recited in claim 1, wherein said first conductive element comprises a material selected from the group consisting of titanium, tungsten, titanium nitride, aluminum and copper.

7. The series-connected pair of transistors as recited in claim 1, wherein said first conductive element comprises tungsten layered upon titanium nitride.

8. The series-connected pair of transistors as recited in claim 1, wherein said second conductive element comprises an interconnect extending along a surface of said second substrate.

9. The series-connected pair of transistors as recited in claim 1, wherein said first source is coupled to a power supply.

10. The series-connected pair of transistors as recited in claim 9, wherein said power supply comprises a positive power supply or ground.

* * * * *